United States Patent
Tsai

(10) Patent No.: US 11,921,155 B2
(45) Date of Patent: Mar. 5, 2024

(54) DICE TESTING METHOD

(71) Applicant: TANGO AI CORP., Hsinchu County (TW)

(72) Inventor: Min-Ju Tsai, Hsinchu County (TW)

(73) Assignee: TANGO AI CORP., Hsinchu County (TW)

( * ) Notice: Subject to any disclaimer, the term of this patent is extended or adjusted under 35 U.S.C. 154(b) by 172 days.

(21) Appl. No.: 17/745,810

(22) Filed: May 16, 2022

(65) Prior Publication Data
US 2023/0366927 A1 Nov. 16, 2023

(51) Int. Cl.
*G01R 31/28* (2006.01)

(52) U.S. Cl.
CPC ..... *G01R 31/2896* (2013.01); *G01R 31/2884* (2013.01); *G01R 31/2889* (2013.01)

(58) Field of Classification Search
CPC ............ G01R 31/2889; G01R 31/2896; G01R 31/2884
See application file for complete search history.

(56) References Cited

U.S. PATENT DOCUMENTS

| 8,485,916 | B2 | 7/2013 | Gill et al. |
| 2007/0038418 | A1 | 2/2007 | Ahn et al. |
| 2009/0115443 | A1* | 5/2009 | Lai .......................... G11C 29/56 324/762.02 |
| 2010/0010768 | A1 | 1/2010 | Good et al. |
| 2011/0251812 | A1* | 10/2011 | Gurov ................ G01R 31/2894 702/82 |

FOREIGN PATENT DOCUMENTS

| CN | 1560646 A | 1/2005 |
| CN | 202006546 U | 10/2011 |
| TW | 200820361 A | 5/2008 |

\* cited by examiner

*Primary Examiner* — Jermele M Hollington
*Assistant Examiner* — Suresh K Rajaputra
(74) *Attorney, Agent, or Firm* — Li & Cai Intellectual Property Office

(57) ABSTRACT

A dice testing method is provided. The dice testing method is used to determine which test data of test items can be explained by test data of other test items based on statistical analysis. After the test items with the test data that can be explained by the test data of the other test items are found out, corresponding dices will not be tested for those test items.

5 Claims, 6 Drawing Sheets

| test item number / dice number | TS1 | TS2 | TS3 | ... | TS1000 |
|---|---|---|---|---|---|
| IC1 | 0 | 1000 | ... | ... | ... |
| IC2 | 1 | 0.01 | ... | ... | ... |
| IC3 | 0 | NaN | ... | ... | ... |
| IC4 | 1 | — | ... | ... | ... |
| IC5 | 0 | 3.8 | ... | ... | ... |
| ... | ... | ... | ... | ... | ... |
| IC7000 | 1 | 3.6 | ... | ... | ... |
| IC7001 | ... | ... | ... | ... | ... |
| ... | ... | ... | ... | ... | ... |
| IC10000 | ... | ... | ... | ... | ... |

| test item number / dice number | TS1 | TS2 | TS3 | ... | TS1000 |
|---|---|---|---|---|---|
| IC1 | 0 | 1000 | 0.42 (PD) | ... | ... |
| IC2 | 1 | 0.01 | 4.3 (WD) | ... | ... |
| IC3 | 0 | NaN | 0.43 | ... | ... |
| IC4 | 1 | | 0.41 | ... | ... |
| IC5 | 0 | 3.8 | 0.42 | ... | ... |
| ... | ... | ... | 0.44 | ... | ... |
| IC7000 | 1 | 3.6 | 0.40 | ... | ... |
| IC7001 | ... | ... | 0.43 | ... | ... |
| ... | ... | ... | 0.41 | ... | ... |
| IC10000 | ... | ... | 0.42 | ... | ... |

DICE TESTING METHOD

FIELD OF THE DISCLOSURE

The present disclosure relates to a dice testing method, and more particularly to a dice testing method for testing large quantities of dices.

BACKGROUND OF THE DISCLOSURE

IC technology has greatly improved in recent years, and a single IC has more and more functions. As such, during packaging tests, test items for the IC have also increased in variety. In some of the packaging tests for the IC, the number of the test items can be more than a thousand. When the number of the test items that need to be performed on a single IC increases, a required test time and a test cost also increase.

At present, in order to save the cost of IC packaging tests, some manufacturers make a manual selection of the test items based on experience and relevant test data, so as to decide which ones of the test items are to be omitted from testing when the IC is packaged and tested. For example, based on previous production test results, a conventional method is to delete the test items that never produce abnormal results and those with a yield rate higher than a predetermined threshold.

In the conventional method, after the IC is tested, the test items excluded from the test will not have any test result data. Due to this, if the IC has any problem in the future or any change or abnormality occurs in an IC production line, relevant personnel can only conduct an analysis based on currently-available and relevant test result data. In other words, no analysis can be performed on the test items that have not been tested due to lack of any relevant test data. Therefore, there may not be an opportunity to analyze an actual cause of a certain IC problem.

SUMMARY OF THE DISCLOSURE

In response to the above-referenced technical inadequacy, the present disclosure provides a dice testing method, so as to overcome the inconvenience caused by manually selecting which test items are not to be tested on dices in a conventional approach.

In one aspect, the present disclosure provides a dice testing method configured to be executed by a dice testing system. The dice testing system stores N test items and is configured to perform N tests on a dice according to the N test items, and the dice testing system executes the dice testing method to test P dices. The N and P are positive integers. The dice testing method includes implementing a first test step, an item selection step, and a second test step. The first test step includes: performing the N tests on P1 dices to obtain P1*N pieces of test data. Here, P1 is a positive integer, and P1≥100. The item selection step includes a data partition step, a data cleaning step, a modeling step, and a verification step. In the data partition step, the P1*N pieces of test data are divided into P11 calculation data sets and P12 verification data sets. Each of a plurality of calculation data sets is N pieces of test data corresponding to the N test items for a single one of the dices, and each of a plurality of verification data sets is the N pieces of test data corresponding to the N test items for a single one of the dices. Here, P11 is 70% of P, P12 is 30% of P, and P11 and P12 are each a positive integer greater than 0. In the data cleaning step, each piece of test data in each of the calculation data sets is read one by one, so as to determine whether or not each of the calculation data sets contains any invalid test data. In response to one of the calculation data sets not containing any invalid test data, each piece of test data corresponding to the one of the calculation data sets is recorded as modeling data. In the modeling step, N partial least square equations are established by using a partial least square method (PLS) and a significance test. A dependent variable of each of the partial least square equations is predicted data obtained after the dice testing system makes one of the dices pass one of the test items. An independent variable of each of the partial least square equations includes the test data corresponding to at least one of the test items that is not the dependent variable, and a P-value of a coefficient of each of the partial least square equations is less than 0.01. In the verification step, the test data included in each of the verification data sets is used to calculate a determination coefficient, a normalized root mean square error (NRMSE), a skew, and a kurtosis for each of the partial least square equations one by one. In response to the determination coefficient of one of the partial least square equations being within a range from 50 to 100, the NRMSE of the one of the partial least square equations being less than or equal to 0.2, the skew of the one of the partial least square equations being greater than or equal to −0.8, and the kurtosis of the one of the partial least square equations being greater than or equal to 2, the one of the partial least square equations is recorded as one of a plurality of predictable equations, and one of the test items corresponding to the dependent variable of the one of the partial least square equations is recorded as one of a plurality of predictable items. In response to each of the predictable equations predicting the predicted data of one of the dices in one of the predictable items, each of the predictable equations is configured to jointly define a prediction range with the modeling data corresponding to the one of the predictable items. In response to the test data corresponding to one of the dices and one of the predictable items in one of the verification data sets being within the prediction range, and an upper limit of the prediction range is 3 times of a standard deviation of the modeling data corresponding to the predictable item plus the predicted data, a lower limit of the prediction range is the predicted data minus the 3 times of the standard deviation. A sum of the predictable items is defined as T. The second test step includes performing, according to N−T test items that are not recorded as the predictable items, N−T tests on each of P−P1 dices to obtain (P−P1)*(N−T) pieces of test data, and using T partial least square equations and the (P−P1)*(N−T) pieces of test data to calculate (P−P1)*T pieces of predicted data. T is a positive integer.

Therefore, by virtue of "obtaining at least one of the predictable equations by using the partial least square method and the significance test in cooperation with verification of the determination coefficient, the normalized root mean square error, the skew, and the kurtosis," the dice testing method provided by the present disclosure can use the at least one of the predictable equations to predict the predicted data of the test items for which the dices are not actually tested. Accordingly, when the dices have a problem, the relevant personnel can conduct an analysis according to the test data corresponding to each of the test items for each of the dices, so as to achieve advantages of shortening the test time and the test cost of the dices.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 2 is a schematic view showing a display device displaying test data transmitted by a dice testing apparatus according to the present disclosure;

FIG. 3 is a schematic view showing the display device displaying the test data that is recorded as modeling data and transmitted by the dice testing apparatus according to the present disclosure;

FIG. 5 is a schematic view showing the display device displaying a test report according to the present disclosure.

DETAILED DESCRIPTION OF THE EXEMPLARY EMBODIMENTS

Figure 1:
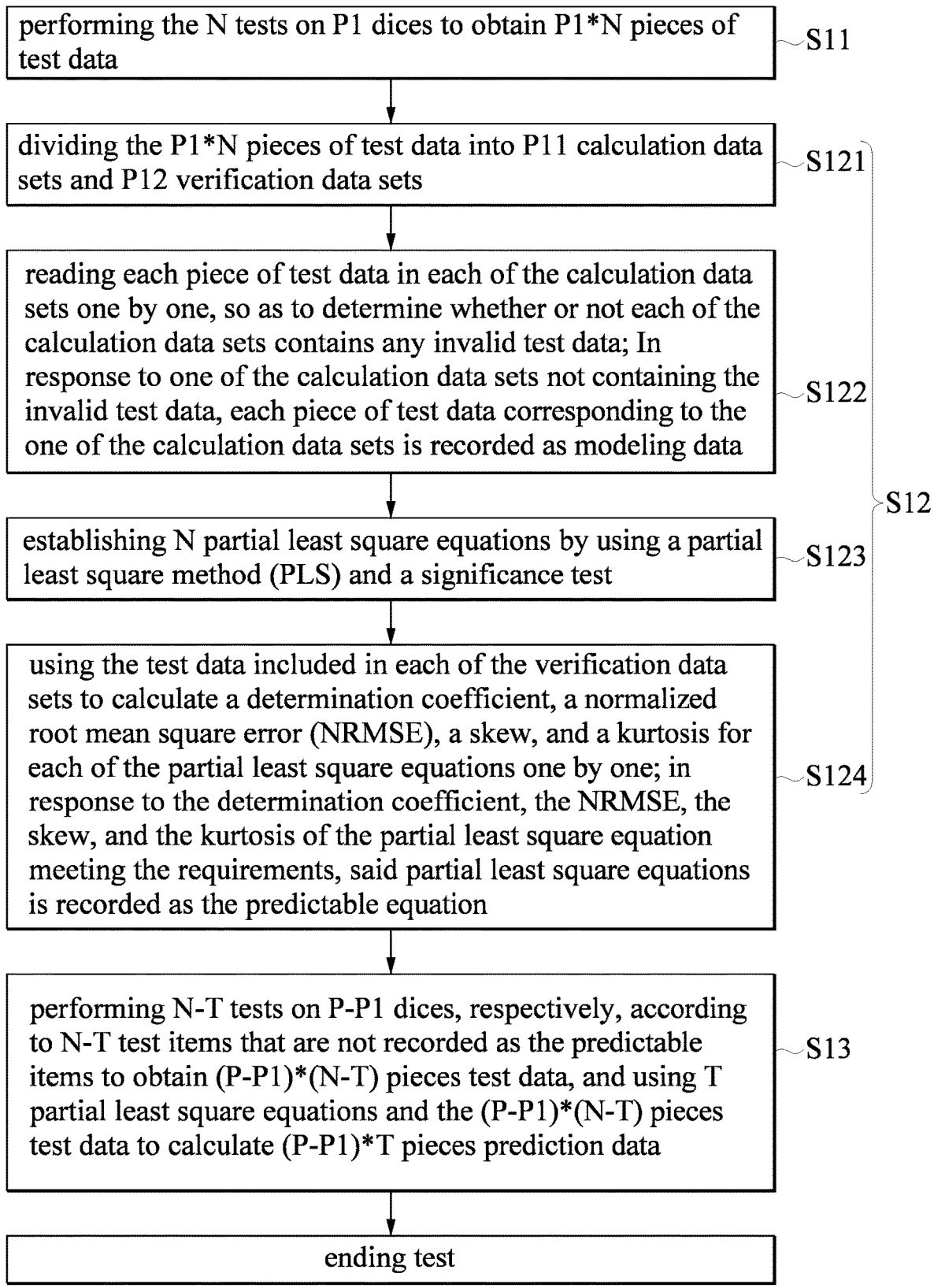
FIG. 1 is a flowchart of a dice testing method according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether or not a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
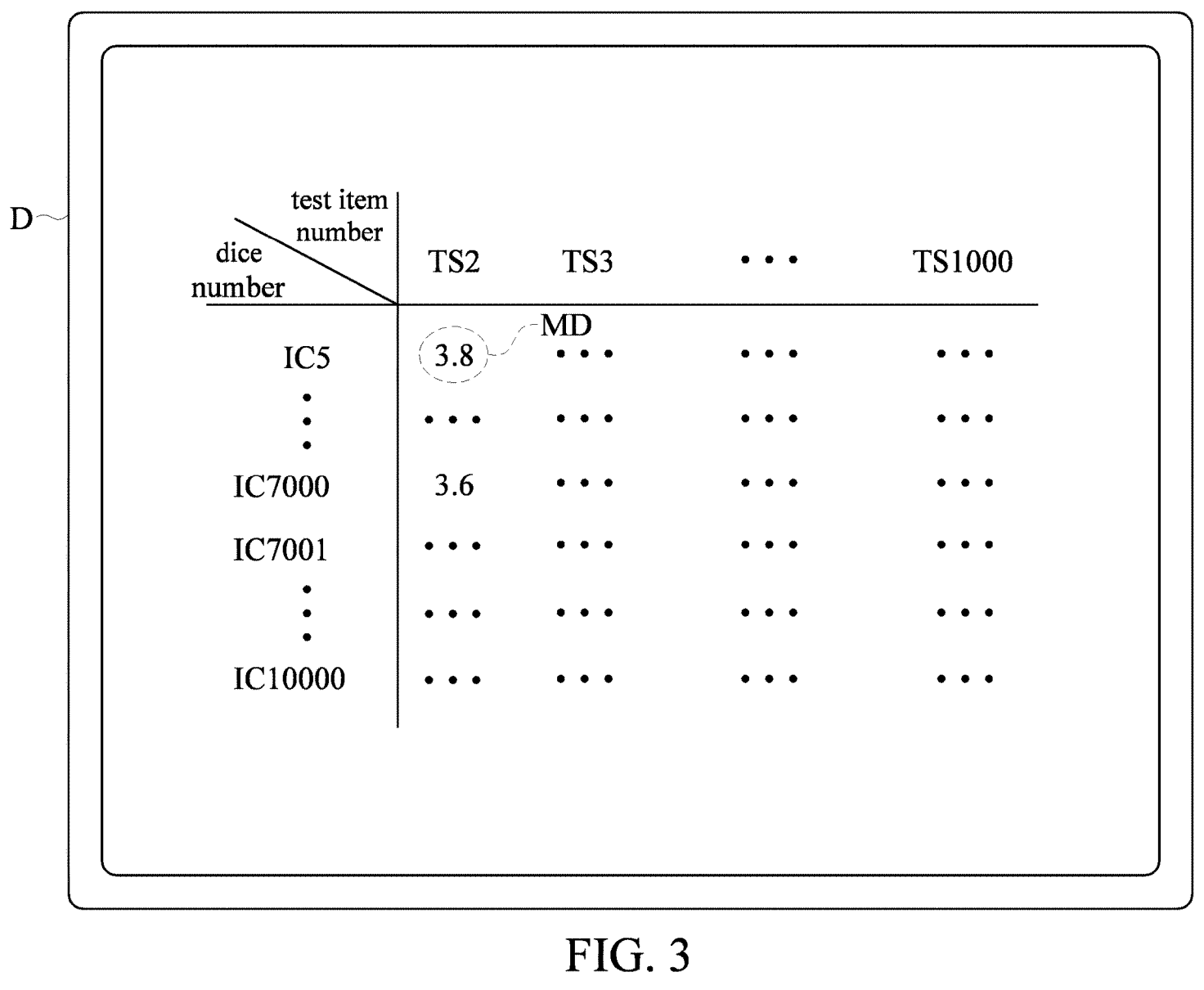

Referring to FIG. 1 to FIG. 3, FIG. 1 is a flowchart of a dice testing method according to the present disclosure. The dice testing method is provided a dice testing system to execute. The dice testing system stores N test items, and is configured to perform N tests on a dice according to the N test items. When the dice testing system executes the dice testing method to test P dices, the dice testing system sequentially executes a first test step S11, an item selection step S12, and a second test step S13. The dices are, for example, ICs, memories, etc., but the present disclosure is not limited thereto.

The first test step S11 includes: performing the N tests on P1 dices to obtain P1*N pieces of test data, in which $P1 \geq 100$.

The item selection step S12 includes the following steps.

A data partition step S121 is to divide the P1*N pieces of test data into P11 calculation data sets and P12 verification data sets. Each of a plurality of calculation data sets is N pieces of test data corresponding to the N test items for the single dice, and each of a plurality of verification data sets is the N pieces of test data corresponding to the N test items for a single one of the dices. Here, P11 is 70% of P, P12 is 30% of P, and P11 and P12 are each a positive integer greater than 0. Moreover, N, P, and P1 are positive integers.

A data cleaning step S122 is to read each piece of test data in each of the calculation data sets one by one, so as to determine whether or not each of the calculation data sets contains any invalid test data. In response to one of the calculation data sets not containing the invalid test data, each piece of test data corresponding to the one of the calculation data sets is recorded as modeling data.

A modeling step S123 is to establish N partial least square equations by using a partial least square method (PLS) and a significance test. A dependent variable of each of the partial least square equations is a predicted data obtained after the dice testing system makes one of the dices pass one of the test items. An independent variable of each of the partial least square equations includes the test data corresponding to at least one of the test items that is not the dependent variable, and a P-value of a coefficient of each of the partial least square equations is less than 0.01.

A verification step S124 is to use the test data included in each of the verification data sets to calculate a determination coefficient, a normalized root mean square error (NRMSE), a skew, and a kurtosis for each of the partial least square equations one by one. In response to the determination coefficient of one of the partial least square equations being within a range from 50 to 100, the NRMSE of the one of the partial least square equations being less than or equal to 0.2, the skew of the one of the partial least square equations being greater than or equal to −0.8, and the kurtosis of the one of the partial least square equations being greater than or equal to 2, the one of the partial least square equations is recorded as one of a plurality of predictable equations and one of the test items corresponding to the dependent variable of the one of the partial least square equations is recorded as one of a plurality of predictable items. A sum of the predictable items is defined as T. In other words, in response to the determination coefficient, the NRMSE, the skew, and the kurtosis of the partial least square equation meeting the requirements, said partial least square equation is recorded as the predictable equation.

Each of the predictable equations predicts the predicted data of one of the dices in one of the predictable items, and can define a prediction range with the modeling data corresponding to the one of the predictable items. In response to the test data corresponding to the dice and the predictable item in one of the verification data sets being within the prediction range, and an upper limit of the prediction range being 3 times of a standard deviation of the modeling data corresponding to the predictable item plus the predicted data, a lower limit of the prediction range is the predicted data minus the 3 times of the standard deviation. For example, in response to one of the calculation data sets containing 300 pieces of test data that are A1, A2, ..., A300 (that is, the 300 pieces of test data are obtained after 300 dices each pass a test item A), a standard deviation 6 is calculated by using A1, A2, ..., A300. In response to one of the partial least square equations predicting that 300 pieces of predicted data obtained after the 300 dices each pass the test item A are B1, B2, ..., B300, the 300 pieces of test data corresponding to the 300 dices and the test item A in one of the verification data sets are C1, C2, ..., C300. In response to the 300 pieces of test data that are A1, A2, ..., A300 and the 300 pieces of test data that are C1, C2, ..., C300 conforming to B1-3σ≤C1≤B1+3σ, B2-3σ≤C2≤B2+3σ, B3-3σ≤C3≤B3+3σ, ..., B300-3σ≤C300≤B300+3σ, the one of the partial least square equations is recorded as one of the predictable equations. Otherwise, the one of the partial least square equations will not be recorded as one of the predictable equations.

A second test step S13 includes: performing, according to N−T test items that are not recorded as the predictable items, N−T tests on each of P−P1 dices to obtain (P−P1)*(N−T) pieces of test data, and using T partial least square equations and the (P−P1)*(N−T) pieces of test data to calculate (P−P1)*T pieces of predicted data. After the dice testing system has executed the second test step S13, the test ends.

As stated above, suppose the dice testing system intends to perform 1,000 test items (i.e., N=1000) on each of 20,000 identical dices (i.e., P=20,000), the step of testing the 20,000 identical dices in the dice testing method of the present disclosure is to perform 1,000 test items on each of 10,000 dices (i.e., P1=10,000), so as to obtain 10,000*1,000 pieces of test data.

Reference is made to FIG. 2, which is a schematic view of a display device D displaying the test data transmitted by a dice testing apparatus. In the data partition step S121, the 10,000*1,000 pieces of test data are divided into 7,000 calculation data sets CS1, CS2, CS3, ..., CS7000 and 3,000 verification data sets VS7001-VS10000. In other words, in response to 10,000 dices being numbered IC1, IC2, IC3, ..., IC10000, the 7,000 calculation data sets CS1, CS2, CS3, ..., CS7000 include the test data of the dices numbered IC1~IC7000 in each of the 1,000 test items, and the 3,000 verification data sets VS7001-VS10000 include the test data of the dices numbered IC7001~IC10000 in each of the 1,000 test items.

In continuation of the above, in the data cleaning step S122 (as shown in FIG. 2), whether or not the test data of the dices numbered IC1~IC7000 corresponding to each of the test items TS1, TS2, TS3, ..., TS1000 is invalid test data (the invalid test data mentioned herein means that no data is measured by the dice testing apparatus or a value measured by the dice testing apparatus obviously exceeds or falls below a preset value, etc., which can be set according to practical requirements) is determined one by one. For example, in response to a voltage inputted by the dice testing apparatus to one of the dices to be tested being 3.8 volts, one of the test items that is numbered TS2 being "testing a current input voltage of the dices", and the test data of the four dices numbered IC1, IC2, IC3, and IC4 in the test item numbered TS2 being respectively 1,000 (volts), 0.01 (volts), NAN (not a number), and blank (no data), the test data included in the calculation data sets CS1, CS2, CS3, CS4 corresponding to the four dices numbered IC1, IC2, IC3, and IC4 will not be recorded as the modeling data. On the contrary, in response to the test data corresponding to the dices numbered IC5~IC7000 being all valid, the test data included in the calculation data sets CS5~CS7000 corresponding to the dices numbered IC5~IC7000 will be recorded as the modeling data.

In one of the embodiments, the P1*N pieces of test data can be divided into N item data sets according to the N test items, and each of the item data sets contains the P1 pieces of test data. In the data cleaning step S122, each piece of test data in each of the item data sets can also be read one by one, so as to firstly count a number of times of each piece of test data appearing in a corresponding one of the item data sets, and then determine whether or not a sum of the number of times that two pieces of test data appear in each of the item data sets is P1. In response to the sum of the number of times that the two pieces of test data appear in one of the item data sets being P1, the test data of the one of the item data sets is not recorded as the modeling data. For example, as shown in FIG. 2, in response to the test data being divided into 1,000 test item sets P1, P2, P3, ..., P1000 according to the 1,000 test items, each of the test item sets contains 10,000 pieces of test data corresponding to the 10,000 dices. In situations where "the test data in the test item set P1 being 0" occurs 9,550 times and "the test data in the test item set P1 being 1" occurs 450 times, the test data included in the test item set P1 will not be recorded as the modeling data in the data cleaning step S122.

In practical application, in the data cleaning step S122, a single dice can be used as a basic unit for determining, one by one, whether or not the calculation data sets corresponding to each of the dices contain any invalid test data, so as to select out the test data that can be defined as the modeling data. A single test item can also be used as the basic unit for determining, one by one, the number of times that the test data appears in each of the item data sets, so as to select out the test data that can be defined as the modeling data. Naturally, in the data cleaning step S122, whether or not the single dice or the single test item is first chosen as the basic unit for selection of the test data can be determined according to practical requirements.

In continuation of the above, reference is made to FIG. 3, which is a schematic view of the display device D displaying the test data recorded as the modeling data and transmitted by the dice testing apparatus. After the data partition step S121 and the data cleaning step S122, the original 1,000 test items are filtered, thus leaving 999 test items. After the original 7,000 calculation data sets are filtered, 6,996 calculation data sets remain. In other words, a total of 999*6,996 pieces of test data are recorded as modeling data MD.

Further, in the modeling step S123, a process establishing one of the partial least square equations of the test item TS2 can include the following steps.

A first step: establishing a linear equation that is YTS2=A0+A1*XTS3+A2*XTS4+A3*XTS5+A6*XTS6+ . . . +A1000*XTS1000. A dependent variable (YTS2) of the linear equation is the test data that may be obtained after the dices pass the test item TS2, and an independent variable of the linear equation is the test data of the other 998 test items. In other words, in response to the dices obtaining 998 pieces of test data after the 998 test items, the linear equation can be used to predict real test data obtained after the dices pass the test item TS2.

A second step: calculating each of coefficients A1, A2, A3, A6, ..., +A1000 in the linear equation by using a partial least square method (PLS).

A third step: performing a significance test on the linear equation in which each of the coefficients A1, A2, A3, A6, ..., +A1000 have been solved, so as to decide which independent variables in the linear equation are to be removed. Finally, a partial minimum equation that can be used to explain the test item TS2 is obtained. For example, in response to the partial minimum equation finally obtained being YTS2=10+20*XTS3+30*XTS5, two pieces of test data that are respectively obtained after the dices pass the test item TS3 and the test item TS5 can be used to predict the real test data that is obtained after the dices pass the test item TS2. In an exemplary application, in the third step, a corresponding one of the independent variable is retained when the P-value of the coefficient is less than 0.01.

In a practical application, in the verification step S124, the determination coefficient ($R^2$) of each of the partial least square equations corresponding to each of the test items is first calculated one by one according to the modeling data. In response to the determination coefficient being within a range from 50 to 100, the current partial least square equations are retained. Then, the NRMSE, the skew, and the kurtosis for each of the partial least square equations that are retained are calculated according to the test data included in the 3,000 verification data sets. Finally, whether or not the NRMSE, the skew, and the kurtosis for each of the partial least square equations meet requirements is to be determined. In response to the NRMSE, the skew, and the kurtosis for each of the partial least square equations meeting the requirements, each of the partial least square equations is recorded as the predictable equation.

After the verification step S124, at least one of the partial least square equations can be obtained, and each of the partial least square equations can be used to predict the real test data obtained after the dices pass one of the test items. For example, in response to one of the partial least square equations that is retained after the verification step S124 being $Y_{TS2}=10+20*X_{TS3}+30*X_{TS5}$, the dice testing apparatus will not use the remaining 10,000 dices for the test item TS2 in the second test step S13. Instead, the test data of the test item TS3 (i.e., $X_{TS3}$) and that of the test item TS5 (i.e., $X_{TS5}$) for one of the 10,000 dices will be introduced into $Y_{TS2}=10+20*X_{TS3}+30*X_{TS5}$, so as to obtain the predicted data (i.e., $Y_{TS2}$). Said predicted data is used to predict the real test data obtained after the dices are tested by the test item TS2.

It should be noted that, for the test items that are omitted and not tested in the dice testing method of the present disclosure, the predicted data is still calculated through a corresponding one of the predictable equations. In other words, each of the dices will have data corresponding to each of the test items, and the data may be the test data obtained after passing the test or may be the predicted data obtained by using the corresponding one of the predictable equations. Therefore, in response to the dices having problems, the relevant personnel can more comprehensively determine the real cause for the dices to have such problems. On the contrary, in order to save testing time during a traditional dice testing process, the relevant personnel tend to directly set the dice testing equipment not to test some of the test items based on past experiences. Therefore, after the dices have been tested, the test items that are originally set as unnecessary for testing will have no corresponding data at all. As a result, in response to the dices having problems, the relevant personnel cannot correctly find out the real cause for the dices to have such problems due to not having the required data.

Figure 4:
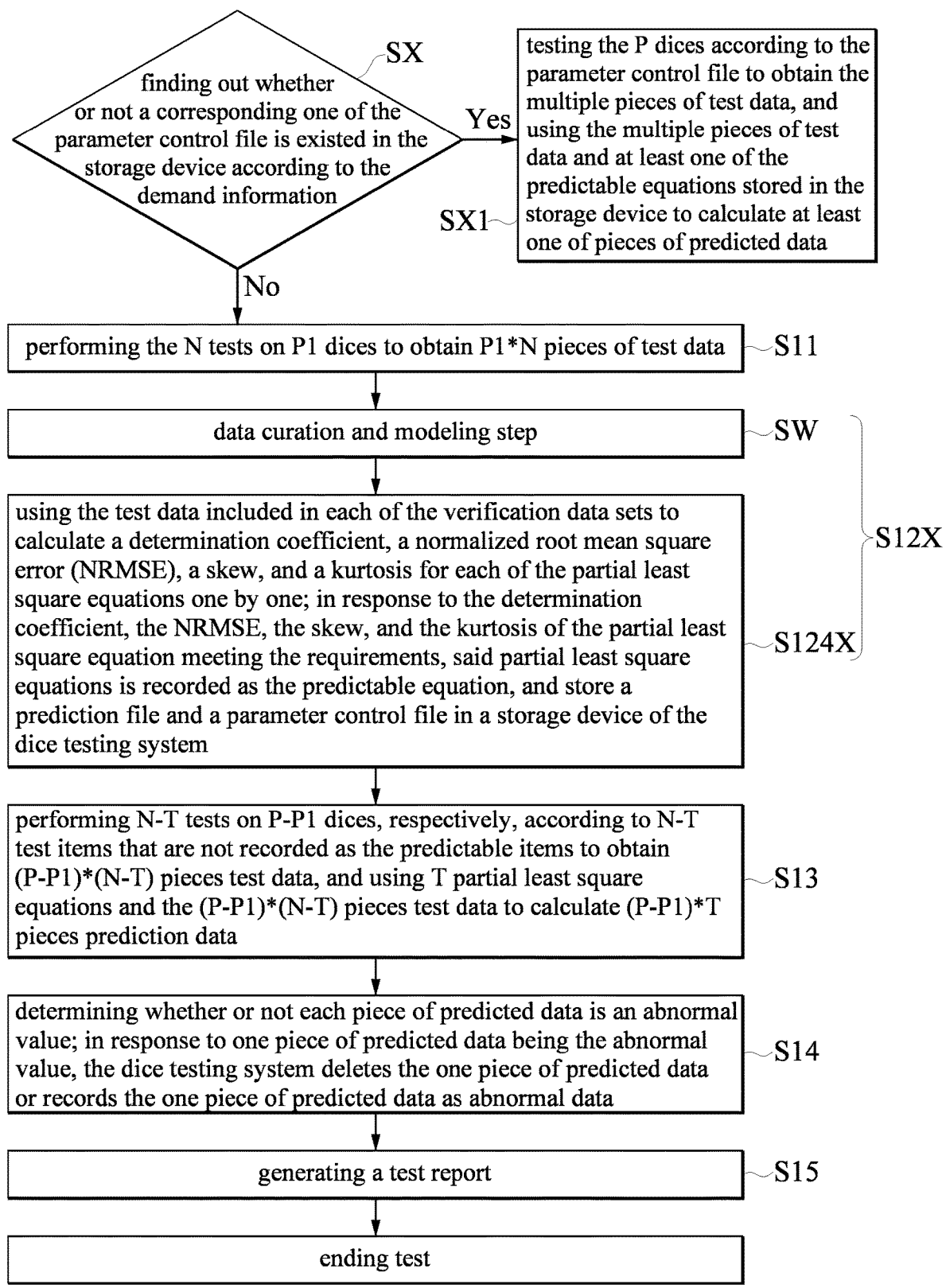
FIG. 4 is another flowchart of the dice testing method according to the present disclosure.

Referring to FIG. 4, FIG. 4 is a flowchart of the dice testing method according to another embodiment of the present disclosure. In order to clearly show the differences between the present embodiment and the previous embodiment, the data partition step S121, the data cleaning step S122, and the modeling step S123 in the drawings of the present embodiment are presented in a data curation and modeling step SW.

One of the differences between the present embodiment and the previous embodiment resides in that a verification step S124X of the present embodiment not only includes all the actions in the verification step S124 of the previous embodiment, but also includes the following action: storing a prediction file and a parameter control file in a storage device of the dice testing system. The prediction file includes dice information, the predictable items, and the predictable equations that correspond to the predictable items. The parameter control file includes the dice information and a plurality of required test items that are remaining test items after deducting the predictable items from the test items. It should be noted that the parameter control file refers to what is commonly known as "recipe file". The storage device can be, for example, various hard disks, servers, memory, and the present disclosure is not limited thereto.

In practical application, the prediction file can be designed according to practical requirements. For example, the prediction file can be stored in a form of a document file, or can be stored in a form of a program execution file. In response to the prediction file being stored in the form of the document file, the relevant personnel can, for example, open the prediction file by operating a relevant input device (e.g., a keyboard, a mouse, or a touch screen) or a relevant computer device of the dice testing system. After the prediction file is opened, the relevant personnel can, for example, view the dice information and a list of the predictable items and the predictable equations corresponding to each of the predictable items on the display device. For example, on the display device, the relevant personnel can see contents such as "dice number: IC1011", "test item: TS2", and "predictable equation: YTS2=10+20*XTS3+ 30*XTS5 . . . ".

In response to the dice testing system or a relevant computer apparatus executing the prediction file stored in the form of the program execution file, the relevant personnel may, for example, see a request for inputting multiple pieces of test data on an operation interface. After the multiple pieces of test data are entered, the prediction file will perform the calculation by itself, so as to calculate the relevant predicted data. Naturally, in different applications, the dice testing system can also selectively generate prediction files in different forms according to a user operation.

In a practical application, the parameter control file can be stored in any file format. After the relevant personnel open the parameter control file through a corresponding application program, the relevant personnel can see contents such as "dice number: IC1011" and "test item: TS1, TS3 . . . ". For example, the parameter control file can be stored in CSV file format, and the relevant personnel can use applications such as Microsoft® EXCEL to open the parameter control file.

As mentioned above, the prediction file contains information about which test items do not need to be tested and can be predicted by the predictable equations. The prediction file also contains predictable equations for predicting the test items that can be predicted. The parameter control file contains information about which test items need to be tested. In other words, after the dice testing system reads the parameter control file and the prediction file, the dice testing system will know which test items are used for testing each of the dices and which test items are not used, and the dice testing system can also use the predictable equations to predict the predicted data of the test items for which the dices are not tested.

One of the differences between the present embodiment and the previous embodiment resides in that the dice testing method further includes a parameter control file confirmation step SX before the first test step S11. The parameter control file confirmation step SX is to receive demand information and finding out whether or not a corresponding one of the parameter control file is existed in the storage device according to the demand information. In response to the corresponding one of the parameter control file being existed in the storage device, the dice testing system executes a parameter control file test step SX1. The parameter control file test step SX1 is to test the P dices according to the parameter control file to obtain the multiple pieces of test data, and use the multiple pieces of test data and at least one of the predictable equations stored in the storage device to calculate multiple pieces of predicted data.

For example, in response to the dice testing system testing the dices under model number IC1001 by executing the dice testing method of the present embodiment, after all the tests are completed, the storage device of the dice testing system will store the prediction file and the parameter control file of the dices under model number IC1001 (i.e., the dice information). Then, in response to the dice testing system testing to-be-tested dices that have the same model number by executing the dice testing method of the present embodiment, the dice testing system will request the user or related apparatuses to provide a model number of the to-be-tested dices (i.e., the demand information) during execution of the parameter control file confirmation step SX. Afterwards, the dice testing system will use the information of "the model number of the dices being IC1001" to check whether or not there are the prediction file and the parameter control file of the dices having the same model number in the storage device. In response to the prediction file and the parameter control file of the dices having the same model number being found in the storage device, the dice testing system will execute the parameter control file test step SX1, so that the prediction file and the parameter control file that are found can be used for performing corresponding test operations on the to-be-tested dices.

Simply speaking, in response to the prediction file and the parameter control file of the dices having the same model number already presenting in the dice testing system, the dice testing system will not execute the first test step S11, the item selection step S12, and the second test step S13. According to the parameter control file, the dice testing system will decide which test items are to be used for testing each of the dices. After each of the dices completes the test items recorded in the parameter control file and generates the test data, the dice testing system will use said test data to predict the predicted data that can be obtained after the dices are tested by the predictable items through the corresponding predictable equations in the prediction file.

As mentioned above, by virtue of the parameter control file confirmation step SX, as long as the dice testing system has tested the dices having the same model number and stored the corresponding prediction file and the parameter control file, when the dice testing system is to test the dices having the same model number again, the dice testing system will directly use the prediction file and the parameter control file to perform related tests on the dices. Accordingly, the dice testing system can further save inspection time and inspection cost. In continuation of the example above, if a relevant manufacturer wants to test a second batch of 200,000 identical dices, since the storage device of the dice testing system already has the prediction file and the parameter control file obtained by the dice testing system during testing of the previous batch, the dice testing system tests the second batch of the 200,000 identical dices by performing 900 test items on each of the dices. Therefore, compared with a conventional testing method, the dice testing method of the present disclosure can save 20 (times)*100 (items)*1 minute=2000 minutes (about 33 hours and 20 minutes) and about 34 hours of testing costs (about 3400 US dollars). Or, the dice testing method of the present disclosure can save 200,000 (pieces)* 100 (items)*US$0.01=US$200,000 in testing costs.

In another embodiment, the demand information can also contain data of a selected prediction file and data of a selected parameter control file. Specifically, in response to the dice testing system previously performing tests on the dices under model number IC1001, the dice testing system has the corresponding prediction file and the corresponding parameter control file. In response to the demand information being configured to select the prediction file and the parameter control file of the dices under model number IC1001 for use when the dice testing system wants to test the dices under model number IC1002, the dice testing system will determine in the parameter control file confirmation step SX that there are the prediction file and the parameter control file corresponding to the dices under model number IC1002 in the storage device due to the content of the demand information. Accordingly, the parameter control file test step SX1 is executed.

It is worth noting that the demand information in a different embodiment can also record data of the test items that must be tested, and the test items that are recorded as necessary for testing will not be recorded as preset items in the subsequent steps.

One of the differences between the present embodiment and the previous embodiment resides in that the dice testing method further includes a predicted data detection step S14 after the second test step S13. The predicted data detection step S14 is to determine whether or not each piece of predicted data is an abnormal value. In response to one piece of predicted data being the abnormal value, the dice testing system deletes the one piece of predicted data or records the one piece of predicted data as abnormal data. A definition of the abnormal value can be set according to the requirements. For example, the abnormal value can be set to be 0, a specific value, a negative value, no value, etc.

It should be noted that, in the predicted data detection step S14, the dice testing system uses a single test item as a basic unit for determining a corresponding abnormal value of the predicted data that corresponds to different dices in the same test item. In other words, the dice testing system may use different determination criteria to determine whether or not the predicted data corresponding to the different test items are the abnormal data. For example, in response to the test item TS2 and the test item TS3 being recorded as the predictable items, and preset data for the test item TS2 and that for the test item TS3 in one of the dices being both 0, the dice testing system may determine in the predicted data detection step S14 that the predicted data for the test item TS2 is the abnormal data, while the predicted data for the test item TS3 is normal data.

One of the differences between the present embodiment and the previous embodiment resides in that the dice testing method further includes a report generation step S15 after the predicted data detection step S14. The report generation step S15 is to generate a test report. The test report includes a test result of each of the dices for each of the test items, and the test result is the test data or the predicted data. The dice testing system also flags each piece of abnormal data in the test report. After the dice testing system executes the report generation step S15, the test ends.

The test report as referred to herein is mainly provided for the relevant personnel to read, check, and use. For example, the test report can be saved in CSV file format. In response to the relevant personnel using Microsoft® EXCEL to open the test report, the relevant personnel can, for example, see the screen shown in FIG. 5. In the screen shown in FIG. 5, a dice number of each of the dices, the test data for each of the test items, normal predicted data PD (e.g., data shown in bold font in the drawing), or predicted data WD (e.g., data shown in bold font and underlined in the drawing) are illustrated. It should be noted that the dice testing method in a different embodiment may also not include the predicted data detection step S14 and the report generation step S15.

It should be noted that the dice testing method can also execute the predicted data detection step S14 and the report generation step S15 after the parameter control file test step SX1 is executed.

Figure 6:
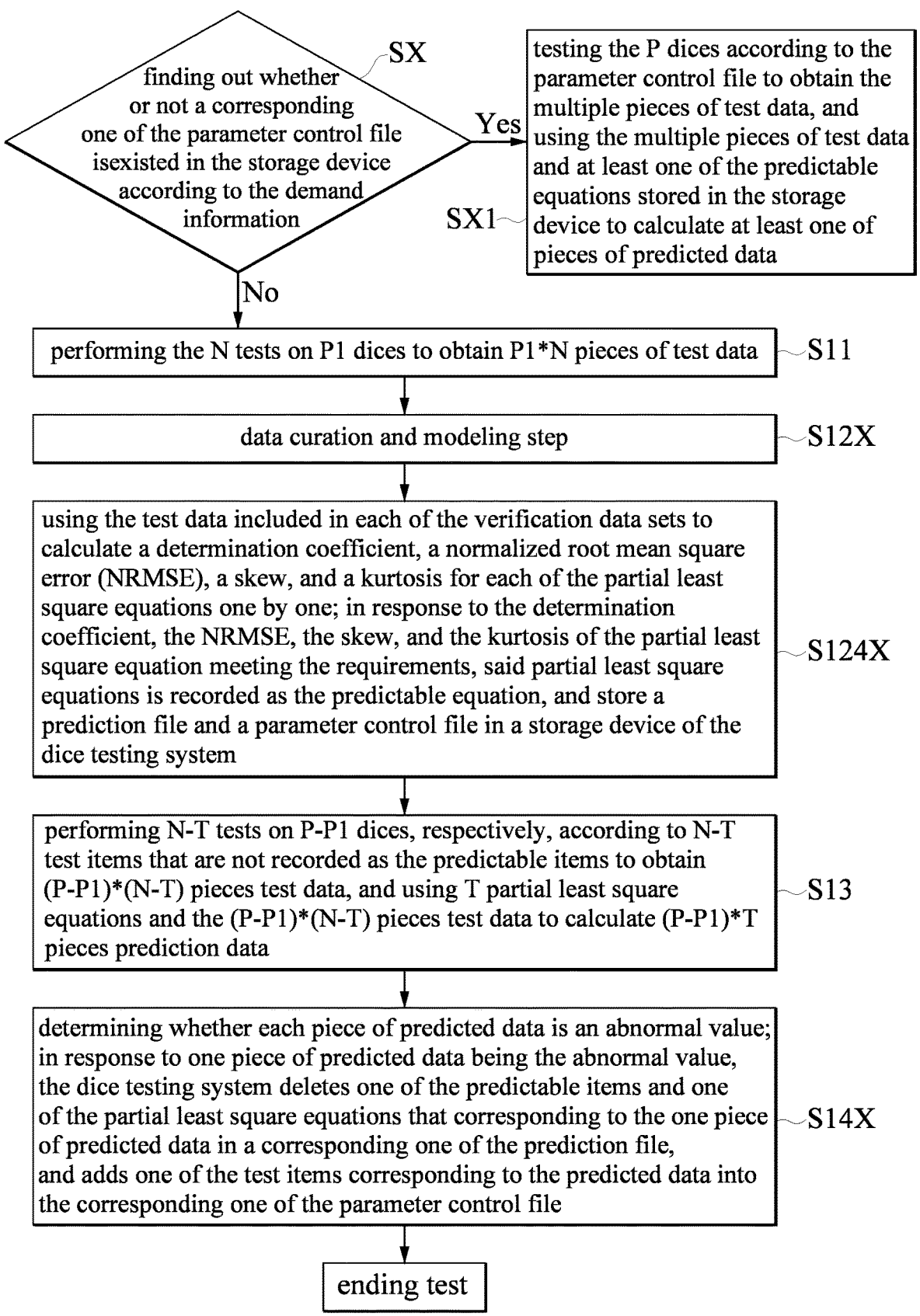
FIG. 6 is yet another flowchart of the dice testing method according to the present disclosure.

Referring to FIG. 6, FIG. 6 is a flowchart of the dice testing method according to yet another embodiment of the present disclosure. A difference between the present embodiment and the embodiment shown in FIG. 4 resides in that the dice testing method further includes a predicted data detection step S14X after the second test step S13. The predicted data detection step S14X is to determine whether or not each piece of predicted data is an abnormal value. In response to one piece of predicted data being the abnormal value, the dice testing system deletes one of the predictable items and one of the partial least square equations corresponding to the one piece of predicted data in a corresponding one of the prediction file, and adds one of the test items corresponding to the predicted data into the corresponding one of the parameter control file.

For, example, in response to the test item TS2 being recorded as a predictable item, and the predicted data of the dices corresponding to the test item TS2 being determined to be the abnormal value after the predicted data detection step S14X, the test item TS2 and the predictable equation thereof in a corresponding one of the prediction file will be deleted, and the test item TS2 will be added to a corresponding one of the parameter control file. In response to the dice testing system testing another batch of identical dices, the dice testing system will have each of the dices tested for the test item TS2 according to the parameter control file.

In other words, the following situations can be present in the dice testing method of the present embodiment. The dice testing system controls each of the dices to be tested for 900 test items, and uses 100 predictable equations to predict 100 pieces of test data for each of the dices, so as to obtain 900 pieces of real test data and 100 pieces of calculated predicted data for each of the dices. Then, in response to the dice testing system determines that 10 pieces of predicted data are abnormal values after the dice testing system executing the predicted data detection step S14X, and the 10 pieces of predicted data corresponding to 6 test items, the dice testing system will add the 6 test items to a corresponding one of the parameter control file. In response to the dice testing system testing the next batch of identical dices according to the parameter control file, the dice testing system will use 906 test items to test each of the dices.

Beneficial Effects of the Embodiments

In conclusion, compared with the conventional dice testing method and the conventional dice testing equipment, the dice testing method and the dice testing system of the present disclosure can save a lot of testing time and testing cost.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A dice testing method configured to be executed by a dice testing system, wherein the dice testing system stores N test items and is configured to perform N tests on one of a plurality of dices according to the N test items, the dice testing system executes the dice testing method to test P dices, and N and P are positive integers, the dice testing method comprising:

implementing a first test step which includes: performing the N tests on P1 dices to obtain P1*N pieces of test data, wherein P1 is a positive integer, and P1≥100;

implementing an item selection step, which includes:

a data partition step, wherein the P1*N pieces of test data are divided into P11 calculation data sets and P12 verification data sets; wherein each of a plurality of calculation data sets is N pieces of test data corresponding to the N test items for a single one of the dices, and each of a plurality of verification data sets is the N pieces of test data corresponding to the N test items for a single one of the dices; wherein P11 is 70% of P, P12 is 30% of P, and P11 and P12 are each a positive integer greater than 0;

a data cleaning step, wherein each piece of test data in each of the calculation data sets is read one by one, so as to determine whether or not each of the calculation data sets contains any invalid test data; wherein, in response to one of the calculation data sets not containing any invalid test data, each piece of test data corresponding to the one of the calculation data sets is recorded as modeling data;

a modeling step, wherein N partial least square equations are established by using a partial least square method (PLS) and a significance test; wherein a dependent variable of each of the partial least square equations is predicted data obtained after the dice testing system makes one of the dices pass one of the test items; wherein an independent variable of each of the partial least square equations includes the test data corresponding to at least one of the test items that is not the dependent variable, and a P-value of a coefficient of each of the partial least square equations is less than 0.01; and a verification step, wherein the test data included in each of the verification data sets is used to calculate a determination coefficient, a normalized root mean square error (NRMSE), a skew, and a kurtosis for each of the partial least square equations one by one; wherein, in response to the determination coefficient of one of the partial least square equations being within a range from 50 to 100, the NRMSE of the one of the partial least square equations being less than or equal to 0.2, the skew of the one of the partial least square equations being greater than or equal to −0.8, and the kurtosis of the one of the partial least square equations being greater than or equal to 2, the one of the partial least square equations is recorded as one of a plurality of predictable equations, and one of the test items corresponding to the dependent variable of the one of the partial least square equations is recorded as one of a plurality of predictable items; wherein, in response to each of the predictable equations predicting the predicted data of one of the dices in one of the predictable items, each of the predictable equations is configured to jointly define a prediction range with the modeling data corresponding to the one of the predictable items; wherein, in response to the test data corresponding to one of the dices and one of the predictable items in one of the verification data sets being within the prediction range, and an upper limit of the prediction range is 3 times of a standard deviation of the modeling data corresponding to the predictable item plus the predicted data, a lower limit of the prediction range is the predicted data minus the 3 times of the standard deviation; wherein a sum of the predictable items is defined as T; and implementing a second test step which includes: performing, according to N−T test items that are not recorded as the predictable items, N−T tests on each of P−P1 dices to obtain (P−P1)*(N−T) pieces of test data, and using T partial least square equations and the (P−P1)*(N−T) pieces of test data to calculate (P−P1)*T pieces of predicted data; wherein T is a positive integer.

2. The dice testing method according to claim 1, wherein the P1*N pieces of test data are configured to be divided into N item data sets according to the N test items, and each of the item data sets contains the P1 pieces of test data; wherein in the data cleaning step, each piece of test data in each of the item data sets is read one by one, so as to count a number of times that each piece of test data appears in a corresponding one of the item data sets, and then determine whether or not a sum of the number of times that two pieces of test data appear in each of the item data sets is P1; wherein, in response to the sum of the number of times that the two pieces of test data appear in one of the item data sets being P1, the test data of the one of the item data sets is not recorded as the modeling data.

3. The dice testing method according to claim 1, wherein, in the verification step, a prediction file and a parameter control file are further stored in a storage device of the dice testing system; wherein the prediction file includes dice information, the predictable items, and the predictable equations that correspond to the predictable items; wherein the parameter control file includes the dice information and a plurality of required test items, and the required test items are the test items that remain after the predictable items are deducted from the test items; wherein the dice testing method further includes a parameter control file confirmation step before the first test step, and the parameter control file confirmation step is to receive demand information and find out whether or not a corresponding one of the parameter control file is present in the storage device according to the demand information; wherein, in response to the corresponding one of the parameter control file being present in the storage device, the dice testing system executes a parameter control file test step included in the dice testing method; wherein, in the parameter control file test step, the P dices are tested according to the parameter control file so as to obtain multiple pieces of test data, and the multiple pieces of test data and at least one of the predictable equations stored in the storage device are used to calculate at least one of piece of predicted data.

4. The dice testing method according to claim 3, further comprising a predicted data detection step, wherein the predicted data detection step is to determine whether or not each piece of predicted data is an abnormal value; wherein, in response to one piece of predicted data is the abnormal value, the dice testing system deletes one of the predictable items and one of the partial least square equations that correspond to the one piece of predicted data in a corresponding one of the prediction file, and adds one of the test items that corresponds to the one piece of predicted data into the corresponding one of the parameter control file.

5. The dice testing method according to claim 1, further comprising a predicted data detection step, wherein the predicted data detection step is to determine whether or not each piece of predicted data is an abnormal value; wherein, in response to one piece of predicted data being the abnormal value, the dice testing system deletes the one piece of predicted data or records the one piece of predicted data as abnormal data; wherein the dice testing method further includes a report generation step after the predicted data detection step, and the report generation step is to generate a test report; wherein the test report includes a test result of each of the dices for each of the test items, and the test result is the test data or the predicted data; wherein the dice testing system flags each piece of the abnormal data in the test report.

* * * * *